United States Patent [19]

Graham et al.

[11] Patent Number: 5,208,555

[45] Date of Patent: May 4, 1993

[54] CIRCUIT FOR LIMITING MAXIMUM FREQUENCY OUTPUT OF A VOLTAGE CONTROLLED OSCILLATOR

[75] Inventors: Andrew C. Graham, Sunnyvale; Robert C. Burd, San Jose, both of Calif.

[73] Assignee: TriQuint Semiconductor, Inc., Santa Clara, Calif.

[21] Appl. No.: 764,039

[22] Filed: Sep. 23, 1991

[51] Int. Cl.[5] .......................................... H03L 7/085
[52] U.S. Cl. ................................ 331/1 A; 331/11; 331/17; 331/25
[58] Field of Search ................ 331/1 A, 10, 11, 12, 331/14, 17, 25

[56] References Cited

U.S. PATENT DOCUMENTS 4,523,157  6/1985  Sato ........................................ 331/11

FOREIGN PATENT DOCUMENTS 55-149539  11/1980  Japan ....................................... 331/11
2120478    11/1983  United Kingdom ................... 331/10

Primary Examiner—Siegfried H. Grimm
Attorney, Agent, or Firm—Skjerven, Morrill, MacPherson, Franklin, & Friel

[57] ABSTRACT

A circuit is which, when used in a voltage controlled oscillator (VCO) circuit, detects a frequency on the output of the VCO and, if this output frequency is above a certain value, the circuit forces the output frequency of the VCO to decrease until it is below the certain value. This acts to keep the output frequency of the VCO below a selected frequency which can be accurately processed by the feedback circuits driven by the VCO. Once the output frequency of the VCO is below the certain value, the circuit stops forcing the output frequency to decrease, and the circuit becomes transparent. At this point, the conventional feedback circuitry driving the VCO takes over the adjustment of the VCO output frequency.

14 Claims, 2 Drawing Sheets

CIRCUIT FOR LIMITING MAXIMUM FREQUENCY OUTPUT OF A VOLTAGE CONTROLLED OSCILLATOR

FIELD OF THE INVENTION

This invention relates to phase-locked loop circuits and, in particular, to high frequency voltage controlled oscillators used in phase-locked loop circuits.

BACKGROUND OF THE INVENTION

FIG. 1 shows a conventional prior art phase-locked loop (PLL) circuit 10. It will be assumed for purposes of illustration that PLL 10 is designed to output a frequency of 50 MHz with an input reference clock (REFCLK) frequency of 5 MHz. It will also be assumed that the output frequency of voltage controlled oscillator (VCO) 11 decreases with an increased voltage applied to its control terminal.

In FIG. 1, a 5 MHz REFCLK signal is applied to a first input of a phase/frequency (P/F) detector 12. A nominal 50 MHz output signal at PLL output terminal 13 is divided by a divide-by-ten divider 14 to provide a 5 MHz feedback clock (FBCLK) signal to a second input of P/F detector 12.

P/F detector 12 supplies a pump down frequency (PDF) signal, via line 16, to a control terminal of a current pump 18 if it is detected by P/F detector 12 that the frequency of FBCLK is greater than the frequency of REFCLK. This causes current pump 18 to supply or sink, as appropriate, a current to its output line 20 so as to charge/discharge filter 22 and raise/lower the voltage at the control terminal of VCO 11 to lower the output frequency of VCO 11. In one type of VCO 11, an increased voltage at the input of VCO 11 will lower the output frequency of VCO 11. Accordingly, this resulting decrease in VCO 11 output frequency will cause the frequency of FBCLK to decrease until it is equal to the frequency of REFCLK. At this point, P/F detector 12 will stop supplying a PDF signal to current pump 18.

Conversely, if the frequency of FBCLK is less than that of REFCLK, P/F detector 12 will provide a pump up frequency (PUF) signal on line 26 to current pump 18. Current pump 18 then sinks current from line 20 to reduce the voltage on line 20 so as to increase the output frequency of VCO 11 and balance PLL 10.

As can be seen from the above description, PLL 10 will operate in such a manner as to make FBCLK track the frequency and phase of REFCLK. REFCLK is normally operated within a fixed frequency range for which PLL 10 was designed to track. If the frequency of REFCLK is increased beyond the designed range, the VCO 11 output frequency will increase in response, and the output frequency may exceed the maximum operating frequency of the feedback circuitry, shown as divider 14 in FIG. 1. The output of divider 14 may be incorrectly processed due to the excessive frequency, and the frequency of the FBCLK may be less than the frequency of the REFCLK signal, even as the VCO 11 attempts to increase its frequency further in response to a PUF signal on line 26 generated by P/F detector 12. Even if the frequency of REFCLK is then reduced to fall within the designed range, the frequency of FBCLK can remain lower than REFCLK, or stop switching altogether, as a result of the divider 14 being forced beyond its frequency limit. PLL 10 would then be locked in an undesirable state from which it cannot recover.

The lock-up state described above can also occur when first starting up the PLL 10 of FIG. 1, without exceeding the designed range for the REFCLK frequency. If, at power up, the output voltage VFILT on line 20 is initially near the ground potential, VCO 11 will initially begin operating at a very high frequency. If the maximum operating frequency of divider 14 is less than this initial VCO 11 output frequency, this could cause divider 14 to output a FBCLK signal having a frequency less than the frequency of REFCLK. The PLL 10 will then become locked in the previously described undesirable state.

In fact, any disturbance to the PLL 10 during power up or under quiescent conditions that causes the output frequency of VCO 11 to exceed the capabilities of the feedback circuit (e.g., divider 14) could result in the lock up condition.

As clocking speeds are becoming faster and faster, the VCO's used in PLL's to provide these high frequency signals must be designed so as to be capable of exceeding the desired PLL steady state clocking frequency to ensure that the VCO will be able to output the desired clocking frequency under any foreseeable conditions. To achieve maximum economy of performance, the feedback circuitry is operated near its maximum operating frequency, wherein the VCO's maximum frequency usually exceeds that of the feedback circuitry.

Additionally, manufacturers will want to design VCO's to be capable of providing clocking frequencies higher than currently needed in order to meet future needs.

Thus, although the extremely high speed, and possibly state of the art, circuits to be clocked by the output of a high frequency VCO in a PLL are intended to operate at the steady state high output frequency of the VCO, it is not likely that a feedback divider, such as divider 14 in FIG. 1, would be able to accurately process the maximum frequencies outputted by the VCO under all conditions. This could prevent a reliable FBCLK signal from being applied to P/F detector 12 and could delay or prevent the PLL from locking onto the REFCLK frequency.

It would be relatively expensive to provide divider 14 with state of the art components which are specially designed to process the maximum frequency output of the VCO.

What is needed is an economical high speed VCO circuit which avoids the above-identified drawbacks.

SUMMARY OF THE INVENTION

A novel circuit is disclosed herein which, when used in a voltage controlled oscillator (VCO) circuit, detects a frequency on the output of the VCO and, if this output frequency is above a certain value, the circuit forces the output frequency of the VCO to decrease until it is below the certain value. This acts to keep the output frequency of the VCO below a selected frequency which can be accurately processed by the circuits (e.g., feedback circuitry) driven by the VCO. Once the output frequency of the VCO is below the certain value, the circuit stops forcing the output frequency of the VCO to decrease, and the circuit becomes transparent. At this point, the conventional feedback circuitry driving the VCO takes over the adjustment of the VCO output frequency.

Thus, this inexpensive circuit accurately provides a correction of the VCO output without any sacrifice in performance of the circuit (e.g., a PLL) incorporating the VCO.

DETAILED DESCRIPTION OF PREFERRED EMBODIMENT

Figure 1:
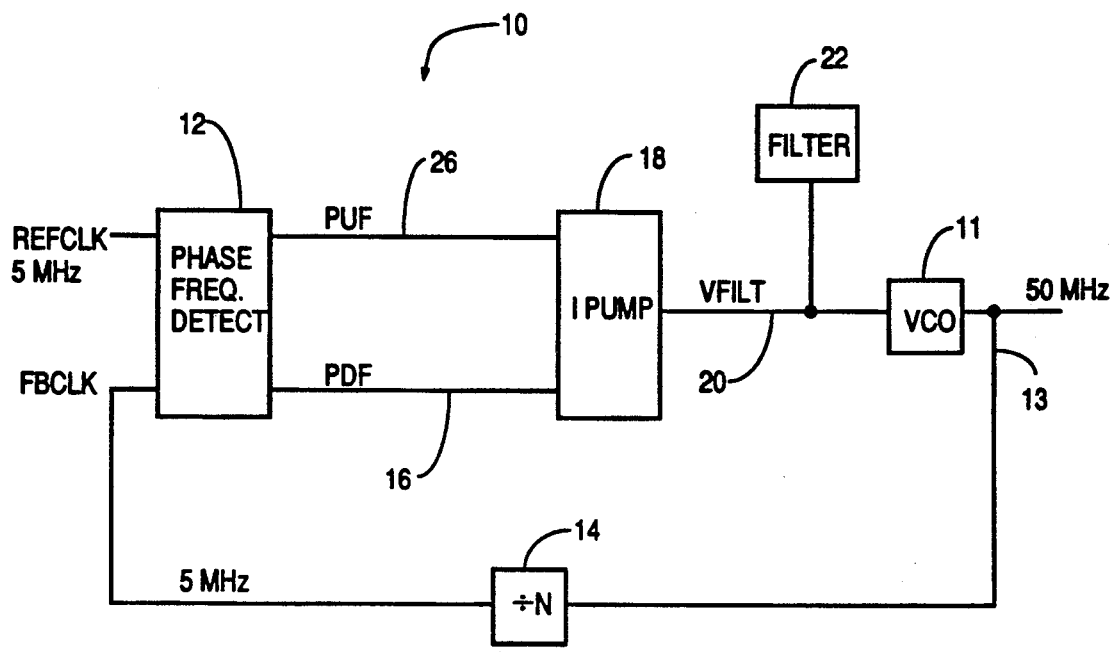
FIG. 1 illustrates a prior art phase-locked loop circuit.
Figure 2:
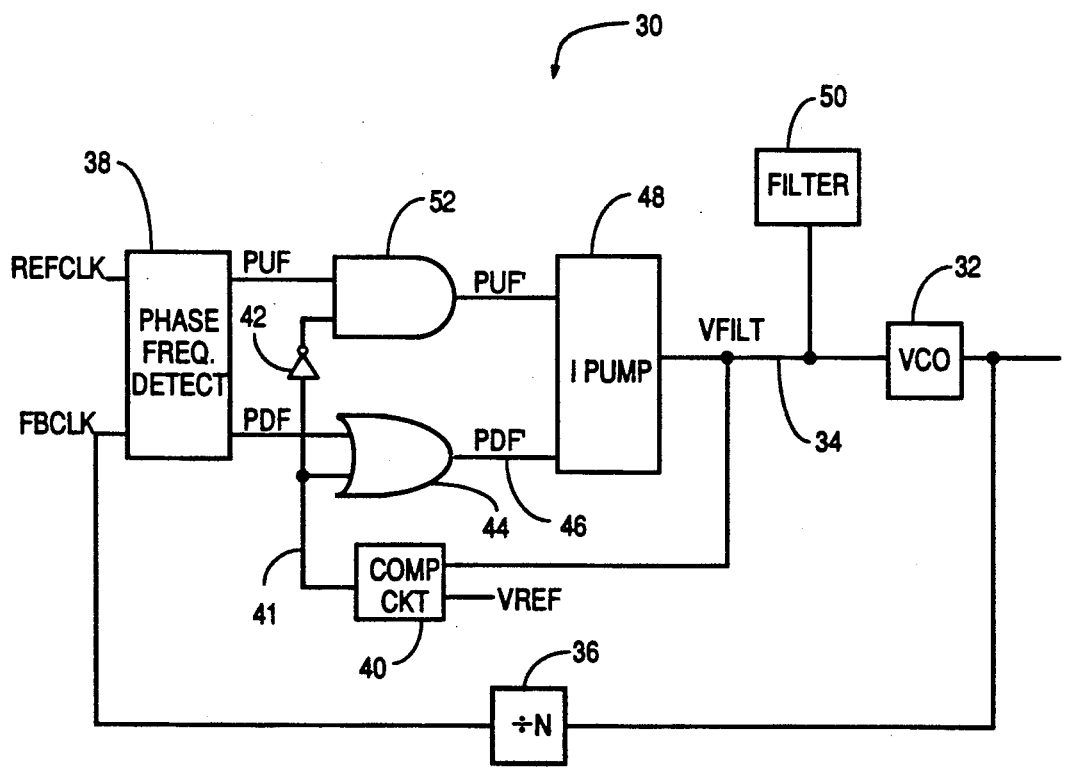
FIG. 2 illustrates one embodiment of the circuit of this invention incorporated into a phase-locked loop circuit such as that shown in FIG. 1.

FIG. 2 shows one embodiment of the circuit of this invention incorporated into a phase-locked loop (PLL) circuit 30. PLL 30 operates identically as prior art PLL 10 of FIG. 1 except when it is detected by comparator 40, to be described in more detail later, that the output frequency of voltage controlled oscillator (VCO) 32 exceeds a certain frequency for any reason, such as when PLL 30 is initially powered up or if the reference clock (REFCLK) frequency increases beyond a certain frequency.

In the below description of the operation of the circuitry of this invention, it will be assumed that VCO 32 in FIG. 2 initially outputs a maximum output frequency during start-up when the voltage on VCO control line 34 is at an initial voltage. This initial voltage may be high or low, wherein this initial voltage drives VCO 32 to an initial maximum output frequency.

Hence, when PLL 30 is initially energized, VCO 32 outputs a maximum frequency, which is presumably higher than the operating speed of divider 36. Thus, if divider 36 (or any feedback circuitry) were to process this maximum frequency output signal, divider 36 could provide an inaccurate feedback signal FBCLK to phase frequency (P/F) detector 38 during this start-up period. Hence, the operation of PLL 30 could be unpredictable and possibly never achieve locking.

To avoid the operation of PLL 30 being based upon such faulty outputs of divider 36 and P/F detector 38, comparator circuit 40 is used to effectively override divider 36 and phase detector 38 during this brief start-up period (or during any period when a VCO 32 output frequency is detected to be above a certain frequency).

Circuit 40 is designed using well-known techniques to detect a voltage on line 34 above or below (as applicable to the particular PLL) a certain reference voltage ($V_{ref}$), which may be applied to a reference terminal of circuit 40. This $V_{ref}$ corresponds approximately to the highest operating input frequency of feedback circuitry 36. A VCO 32 output frequency above this permissible level will thus cause circuit 40 to override the conventional PLL 30 feedback circuitry to reduce the VCO 32 output frequency to at least the permissible level.

Assuming the voltage on line 34 is such as to indicate an output frequency above the permissible level, circuit 40 then outputs a pump down frequency (PDF) signal on line 41. This PDF signal is applied to an input of OR gate 44. OR gate 44 then necessarily outputs a PDF signal on line 46 to control current pump 48 to supply or sink current to/from line 34 to reduce the output frequency of VCO 32. Filter 50 may be a capacitor to raise or lower the voltage on line 34 in response to current pump 48 supplying or sinking current to/from line 34.

A second input of OR gate 44 is connected to a PDF signal output terminal of P/F detector 38.

The PDF signal output of circuit 40 on line 41 is inverted and applied to an input of AND gate 52 so as to be ANDed with any pump up frequency (PUF) signal outputted by P/F detector 38. Since the output of circuit 40 on line 41 is a high PDF signal during this period, the output of AND gate 52 will be low irrespective of any PUF signal output of P/F detector 38.

Thus, during any period in which circuit 40 outputs a PDF signal, the voltage on line 34 will cause the output frequency of VCO 32 to be lowered irrespective of any output of divider 36 or P/F detector 38. The decreasing output frequency of VCO 32 will approach the permissible operating range of divider 36.

In the embodiment of FIG. 2, reference voltage $V_{ref}$ applied to circuit 40 is set to a voltage corresponding to that voltage on line 34 which would cause the output frequency of VCO 32 to be within the operating range of divider 36.

When circuit 40 detects that the output frequency VCO 32 has been suitably lowered, circuit 40 now outputs a $\overline{PDF}$ signal on line 41. This causes the outputs of OR gate 44 and AND gate 52 to now follow the PUF and PDF signals outputted by P/F detector 38. Thus, when the VCO 32 is operating in the permissible range, circuit 40 and gates 44 and 52 effectively become transparent, and the operation of the PLL 30 becomes identical to that of PLL 10 in prior art FIG. 1.

A second reference voltage may also be applied to circuit 40 to identify an output frequency of VCO 32 well within the permissible range before circuit 40 outputs a $\overline{PDF}$ signal on line 41 to provide a hysteresis effect.

Differential signals, if appropriate, may be used in PLL 30 and circuit 40 to make the circuit less affected by noise.

Circuit 40 may be applied in other circuits where appropriate. to

In FIG. 2, OR gate 44 and AND gate 52 are intended merely illustrate one of a number of means to achieve such logic functions. For example, the operation of these logic gates are equivalent to any means which forces P/F detector 38 to provide only a PDF to current pump 48 upon circuit 40 detecting an output frequency of VCO 32 above a permissible level.

Figure 3:
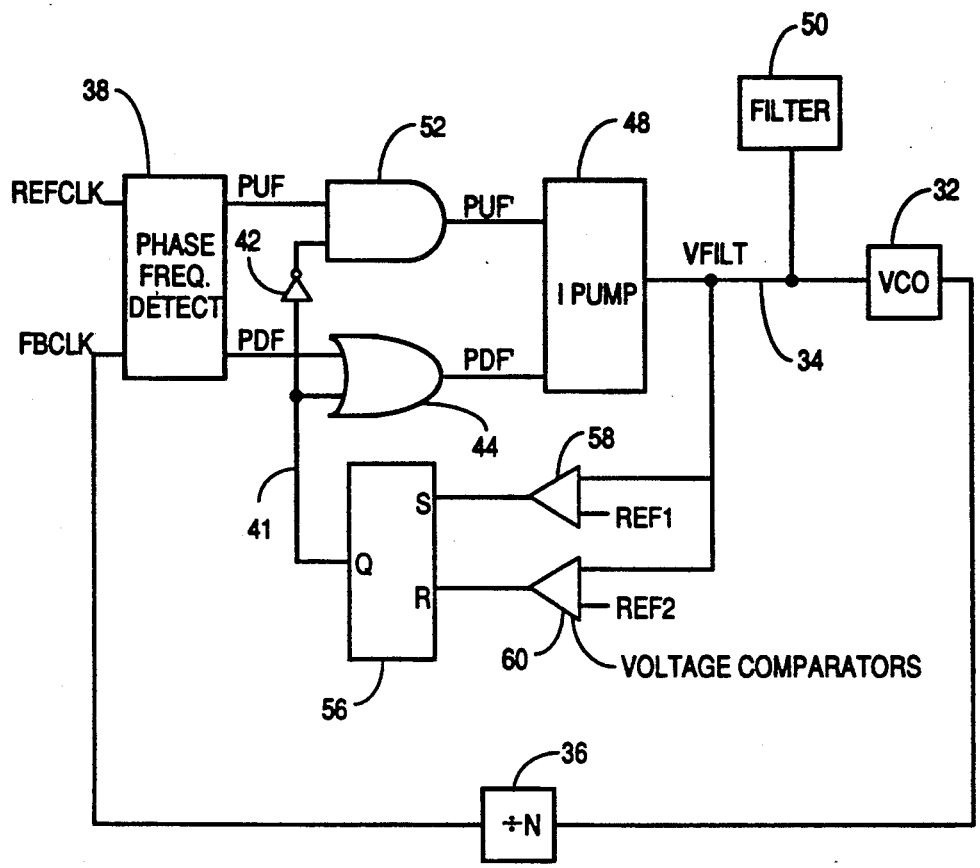
FIG. 3 illustrates the preferred embodiment of a circuit in accordance with the invention.

In the preferred embodiment of FIG. 3, all elements are identical to those in FIG. 2 except for latch circuit 56 and comparators 58 and 60.

Reference voltage REF1 is applied to one input of comparator 58 so as to cause comparator 58 to output a SET signal to latch 56 if comparator 58 detects a voltage on line 34 corresponding to an output frequency of VCO 32 above a permissible level. In response to this SET signal, latch circuit 56 outputs a PDF signal on line 41 so as to lower the output frequency of VCO 32 in a manner identical to that described with respect to FIG. 2.

Latch circuit 56 will continue to output a PDF signal until reset. To this end, a second reference voltage REF2 is applied to one input of comparator 60, wherein REF2 corresponds to a second output frequency well within or lower than the permissible range. When the output frequency of VCO 32 has lowered to this second output frequency, comparator 60 outputs a reset signal to reset latch circuit 56. In this reset condition, latch circuit 56 and gates 44 and 52 are transparent to the operation of the PLL.

Figure 4:
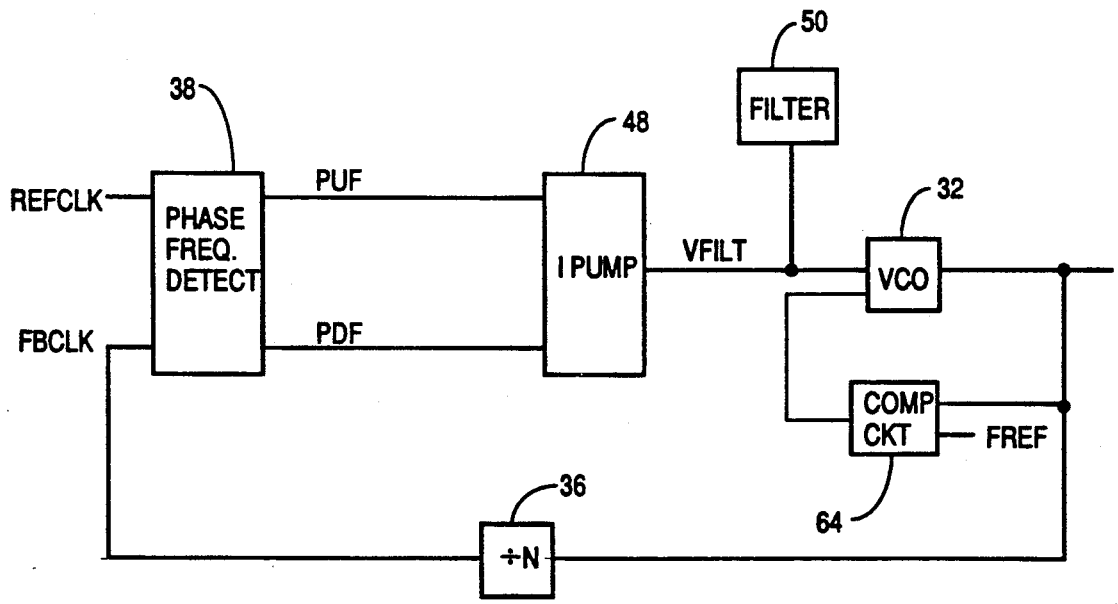
FIG. 4 illustrates another embodiment of a circuit in accordance with the invention.

FIG. 4 illustrates an alternative embodiment of the invention using many elements identical to those used in the PLL's of FIGS. 2 and 3. In FIG. 4, comparator circuit 64, instead of comparing DC voltages, compares a reference frequency FREF to the output frequency of VCO 32. If comparator circuit 64 detects the output frequency of VCO 32 is above a permissible range, it applies a control signal to VCO 32 to decrease its output frequency. Comparator 64 may be modified to operate as a latch in a manner similar to latch circuit 56 in FIG. 3, where a second reference frequency applied to comparator 64 would provide a reset threshold frequency, much like a hysteresis circuit.

P/F detector 38 in all embodiments may be implemented using any well-known type circuitry for detecting a difference in phase/frequency between a first input and a second input terminal. Current pump 48 may be implemented using any conventional circuitry which may supply or sink a current in response to control signals. One of ordinary skill in the art would readily understand how such circuitry may be implemented.

It would be obvious to one of ordinary skill in the art to replace current pump 48 and P/F detector 38 in FIGS. 2–4 with other means well known in the art of phase-locked loops for effectively raising and lowering the control voltage of VCO 32 in response to a comparison of REFCLK and FBCLK.

Numerous embodiments of start-up circuit 40 and the implementations of an equivalent OR gate 44 and AND gate 52 will also be obvious to those of ordinary skill in the art after reading this disclosure.

Filter 50 in FIGS. 2–4 may be connected at one end to ground or to the supply voltage terminal, whichever is appropriate for a specific application.

Accordingly, a circuit for use in a phase locked loop and similar circuits has been described herein. While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit comprising:
    a voltage controlled oscillator (VCO), said VCO generating an output signal having an output frequency;
    a counter having a maximum operating frequency above which said counter no longer accurately performs, said VCO being capable of generating an output signal having an output frequency which exceeds said maximum operating frequency of said counter, said output signal of said VCO being applied to an input of said counter; and
    means for decreasing said output frequency of said VCO if said frequency exceeds a preset limit, said preset limit being chosen based upon said maximum operating frequency of said counter.

2. A circuit comprising:
    a voltage controlled oscillator (VCO), said VCO generating an output signal having an output frequency, wherein said VCO is connected within a phase-locked loop (PLL);
    a first circuit connected to an output of said VCO and having a maximum operating frequency above which said first circuit no longer accurately performs, said VCO being capable of generating an output signal having an output frequency which exceeds said maximum operating frequency of said first circuit; and
    means for decreasing said output frequency if said frequency exceeds a preset limit, said preset limit being chosen based upon said maximum operating frequency of said first circuit.

3. The circuit of claim 2 wherein said means for decreasing said output frequency comprising:
    a first input terminal connected to receive a first signal corresponding to said frequency of said VCO output signal;
    a first comparator means for comparing said first signal to a first reference signal and outputting at a first comparator output terminal a decrease frequency signal if said first comparator means detects said frequency of said VCO output signal is greater than a level corresponding to said first reference signal;
    said decrease frequency signal outputted by said comparator means causing said frequency of said VCO output signal to fall.

4. The circuit of claim 3 wherein said first comparator output terminal is connected to a voltage generating means for changing a level of a VCO control signal, so that when said decrease frequency signal is generated, said control signal will change to lower said frequency of said VCO output signal.

5. The circuit of claim 3 wherein said first comparator output terminal is connected to a phase/frequency detector for detecting a difference in phase/frequency between a reference clock signal and a signal corresponding to said frequency of said VCO output signal, said decrease frequency signal causing said phase/frequency detector to output a control signal so as to cause said frequency of said VCO output signal to lower.

6. The circuit of claim 3 wherein an input terminal of said first comparator means is connected to a control terminal of said VCO.

7. The circuit of claim 3 wherein, when said first comparator means does not generate said decrease frequency signal, said circuit is transparent to said PLL circuit.

8. The circuit of claim 3 further comprising a second comparator means for comparing said first signal to a second reference signal and outputting at a second comparator output terminal a second signal indicating that said frequency of said VCO output signal is below a certain frequency, said second signal causing said frequency of said VCO output signal to not be further lowered by an output of said first comparator.

9. The circuit comprising:
    a voltage controlled oscillator (VCO), said VCO generating an output signal having an output frequency;
    means for decreasing said output frequency if said frequency exceeds a preset limit, said preset limit not being based upon a reference clock frequency, wherein said VCO is connected within a phase-locked loop (PLL) and wherein said means for decreasing said output frequency comprises:
        a first input terminal connected to receive a first signal corresponding to said frequency of said VCO output signal;

a first comparator means for comparing said first signal to a first reference signal and outputting at a first comparator output terminal a decrease frequency signal if said first comparator means detects that said frequency of said VCO output signal is greater than a level corresponding to said first reference signal, said decrease frequency signal outputted by said comparator means causing said frequency of said VCO output signal to fall;

a second comparator means for comparing said first signal to a second reference signal and outputting at a second comparator output terminal a second signal indicating that said frequency of said VCO output signal is below a certain frequency, said second signal causing said frequency of said VCO output signal to not be further lowered by an output of said first comparator, wherein said decrease frequency signal is applied to a latch to set said latch, and said second signal is applied to said latch to reset said latch, an output of said latch being connected to control said frequency of said VCO output signal in response to a set condition of said latch.

10. A circuit comprising:

a voltage controlled oscillator (VCO), said VCO generating an output signal having an output frequency;

means for decreasing said output frequency if said frequency exceeds a preset limit, said preset limit not being based upon a reference clock frequency, wherein said means for decreasing said output frequency comprises:

a first input terminal connected to receive a first signal corresponding to said frequency of said VCO output signal;

a first comparator means for comparing said first signal to a first reference signal and outputting at a first comparator output terminal a decrease frequency signal if said first comparator means detects that said frequency of said VCO output signal is greater than a level corresponding to said first reference signal, said decrease frequency signal outputted by said first comparator means being applied to a first input terminal of a logic gate means, a second input terminal of said logic gate means being connected to a first output terminal of a phase/frequency detector for detecting a difference in phase/frequency between a reference clock signal and a signal corresponding to said frequency of said VCO output signal, a signal of a first logic level applied to said first or second input terminal of said logic gate means causing said logic gate means to output a signal to lower said VCO output frequency, an output terminal of said logic gate means being connected to an input of a voltage generating means for changing a level of a VCO control signal, so that when said decrease frequency signal is generated by said first comparator means, said VCO control signal will change to lower said frequency of said VCO output signal, wherein, when said first comparator means does not generate said decrease frequency signal, said logic gate means is transparent to an operation of said phase/frequency detector and said VCO.

11. The circuit of claim 10, further comprising:

a second comparator means for comparing said first signal to a second reference signal and outputting at a second comparator output terminal a second signal indicating that said frequency of said VCO output signal is below a certain frequency, said second signal being connected to said first input terminal of said logic gate means, said second signal causing said logic gate means to generate a signal to cause said frequency of said VCO output signal to not be further lowered.

12. The circuit of claim 10 wherein said logic gate means comprising:

a first logic gate, said first logic gate having a first input terminal connected to said output terminal of said first comparator means, said first logic gate having a second input terminal connected to a first output terminal of said phase/frequency detector, said first logic gate having an output terminal connected to a first input terminal of said voltage generating means, whereby, when said first comparator means generates said decrease frequency signal, said first logic gate also outputs a decrease frequency signal which causes said voltage generating means to decrease said output frequency of said VCO;

a second logic gate having a first input terminal connected to said output terminal of said first comparator means, said second logic gate having a second input terminal connected to a second output terminal of said phase/frequency detector, said second logic gate having an output terminal connected to a second input terminal of said voltage generating means, whereby, when said first comparator means generates said decrease frequency signal, said second logic gate blocks any increase frequency signal generated by said phase/frequency detector from being applied to said voltage generating means and allows said voltage generating means to decrease said output frequency of said VCO, wherein, when said first comparator means is not generating a decrease frequency signal, said first logic gate and said second logic gate relay all signals generated by said phase/frequency detector directly to said voltage generating means, causing said output signal of said VCO to be controlled by said phase/frequency detector.

13. The circuit of claim 2 wherein said first circuit includes a counter.

14. The circuit of claim 2 wherein said first circuit includes a phase/frequency detector.

* * * * *